United States Patent [19]

Chwalck

[11] Patent Number: 5,418,802
[45] Date of Patent: May 23, 1995

[54] FREQUENCY TUNABLE WAVEGUIDE EXTENDED CAVITY LASER

[75] Inventor: James M. Chwalek, Rochester, N.Y.

[73] Assignee: Eastman Kodak Company, Rochester, N.Y.

[21] Appl. No.: 152,559

[22] Filed: Nov. 12, 1993

[51] Int. Cl.⁶ ............................................. H01S 3/10
[52] U.S. Cl. ........................................ 372/20; 372/32; 372/64; 372/96; 372/97; 372/98; 372/102; 372/22
[58] Field of Search ................... 372/18, 64, 22, 99, 372/21, 96, 97, 20, 102, 32

[56] References Cited

U.S. PATENT DOCUMENTS

| | | | |
|---|---|---|---|
| 4,667,331 | 5/1987 | Alferness et al. | 372/12 |
| 5,119,393 | 6/1992 | Oka et al. | 372/20 |
| 5,170,402 | 12/1992 | Ogita et al. | 372/26 |
| 5,175,681 | 10/1992 | Aoyagai et al. | 372/20 |
| 5,177,758 | 1/1993 | Oka et al. | 372/102 |
| 5,185,752 | 2/1993 | Welch et al. | 372/96 |
| 5,220,578 | 6/1993 | Koch et al. | 372/96 |
| 5,253,314 | 10/1992 | Alferness et al. | 385/40 |
| 5,291,512 | 3/1994 | Suzuki | 372/99 |
| 5,301,201 | 4/1994 | Dutta et al. | 372/20 |
| 5,311,540 | 5/1994 | Pacholle et al. | 372/97 |
| 5,325,392 | 6/1994 | Tohmori et al. | 372/96 |

OTHER PUBLICATIONS

R. W. Tkrach and R. Chraplyvy, J. Lightwave Tech, LT-4, 1655 1986.
Zernike and Midwinter, Applied Nonlinear Optics, Wiley, New York 1973 Chap. 5.

Primary Examiner—Léon Scott, Jr.
Attorney, Agent, or Firm—Raymond L. Owens

[57] ABSTRACT

A frequency tunable waveguide extended cavity laser formed with a laser diode, a channel waveguide comprising an electro-optic material, a frequency tunable Bragg grating reflector formed in or on the channel waveguide and a pair of conducting electrodes. The frequency of radiation produced by the frequency tunable waveguide extended cavity laser is adjusted so as to be at a desired frequency by applying a voltage to the conducting electrodes. The device further incorporates a waveguide nonlinear optical frequency converter to produce frequency convened radiation at a higher frequency. Feedback means are included for dynamically controlling the desired frequency so as to be at a frequency for optimum frequency conversion.

23 Claims, 5 Drawing Sheets

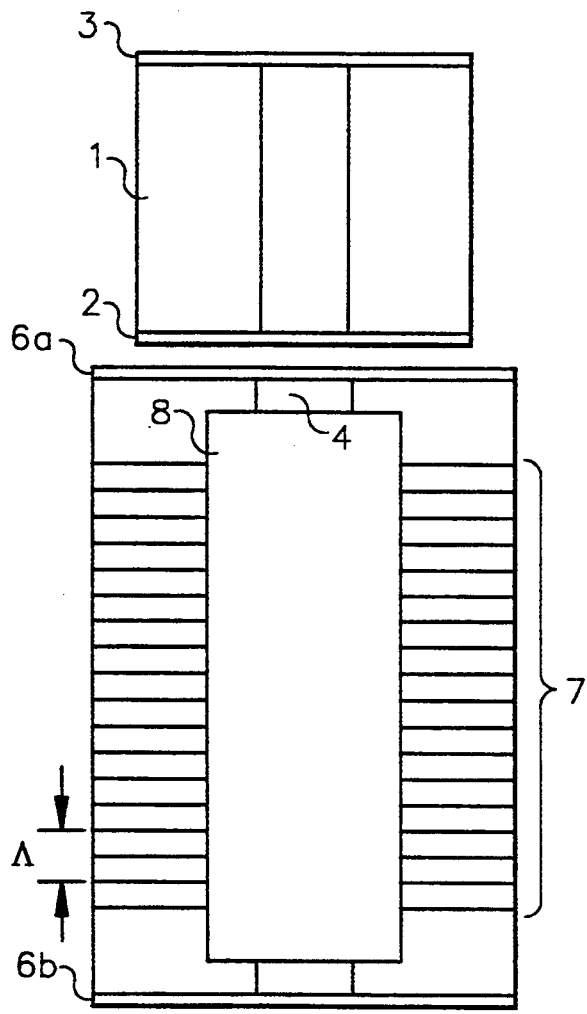
FIG. IA
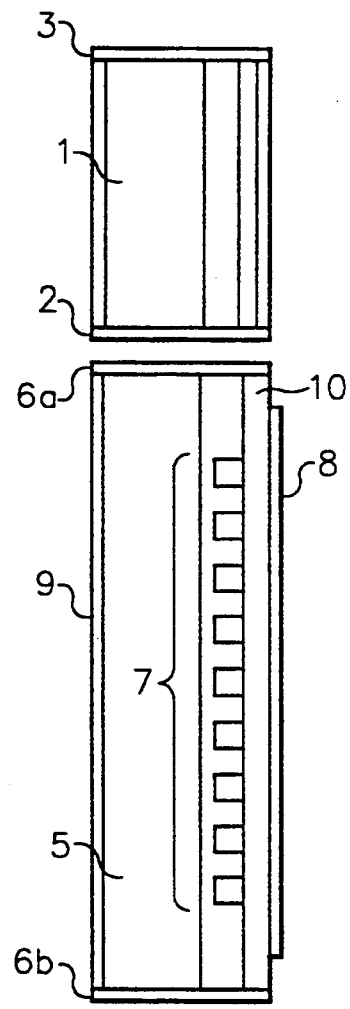
FIG. IC
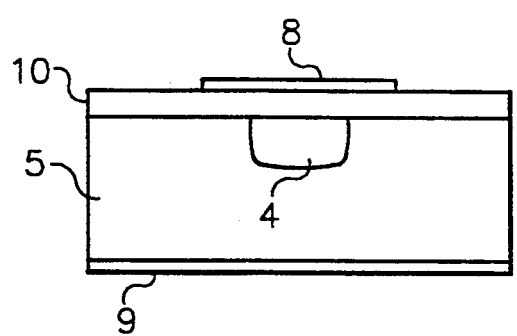
FIG. IB

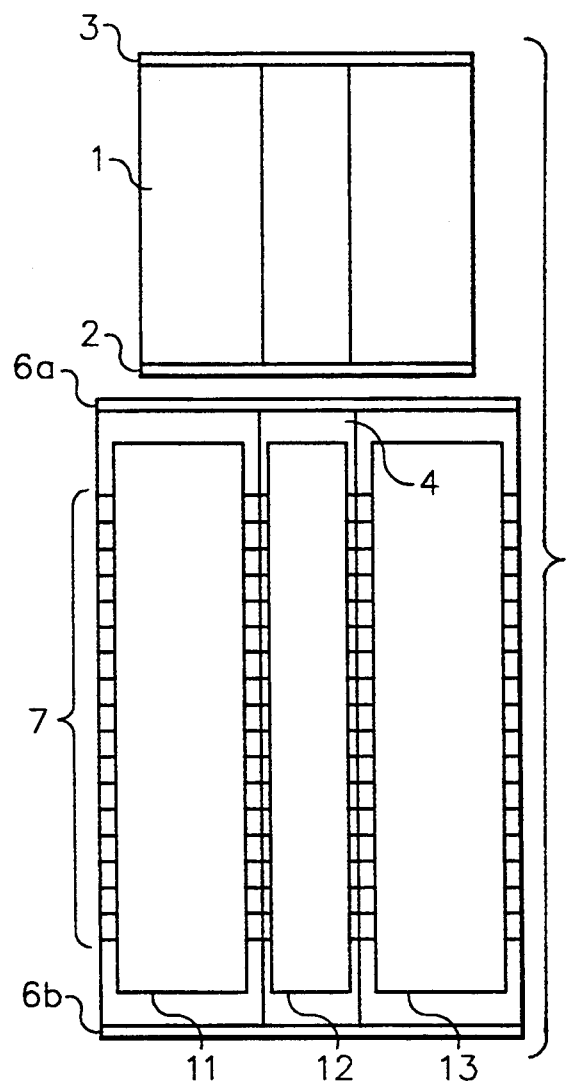
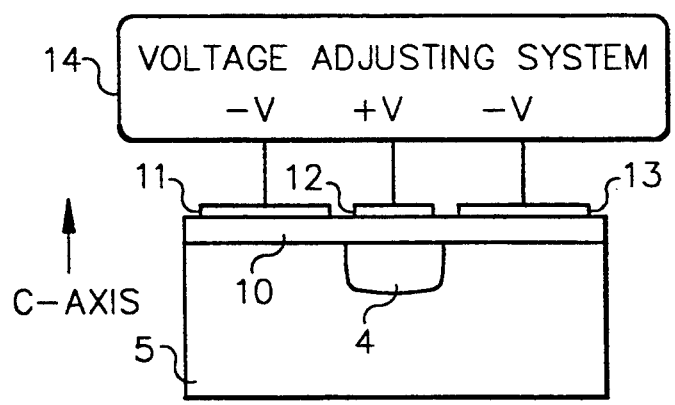
FIG. 2A
FIG. 2B

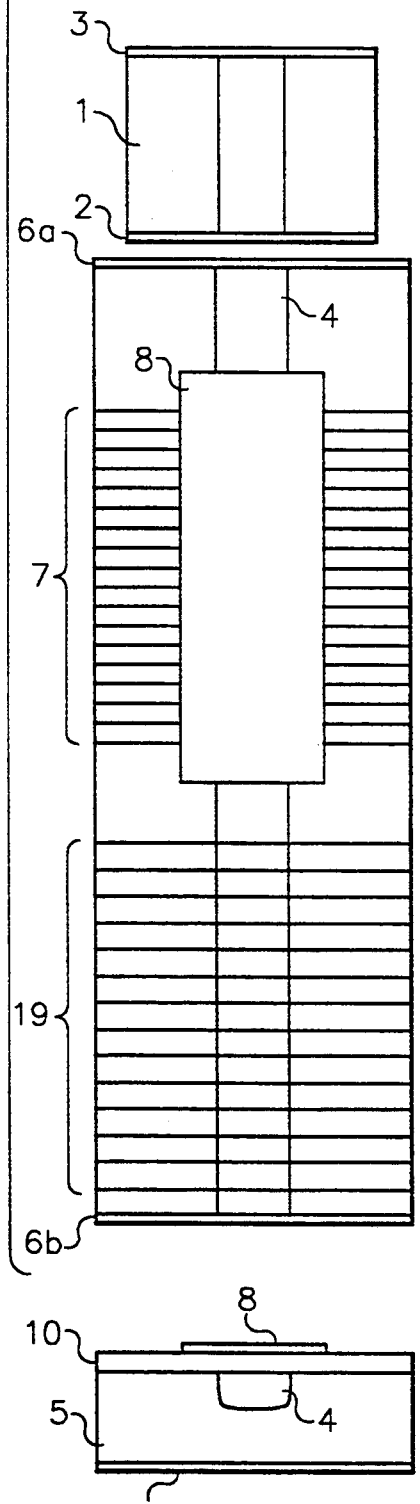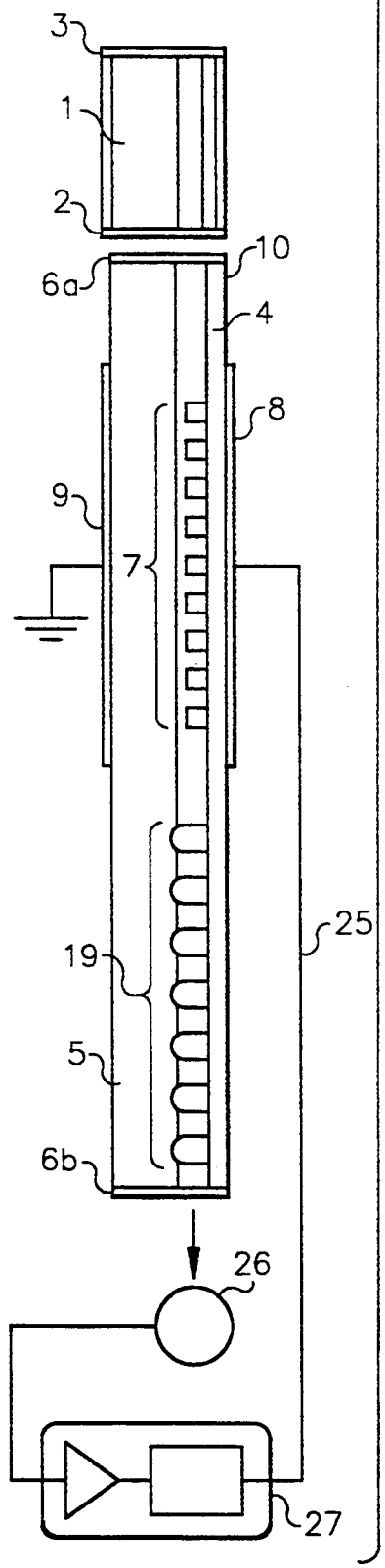

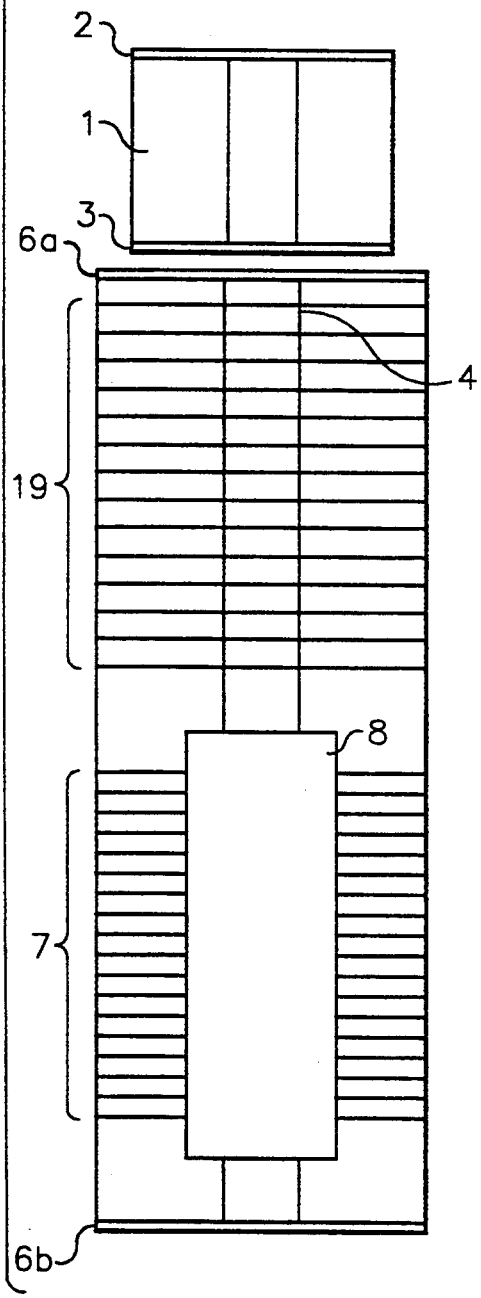
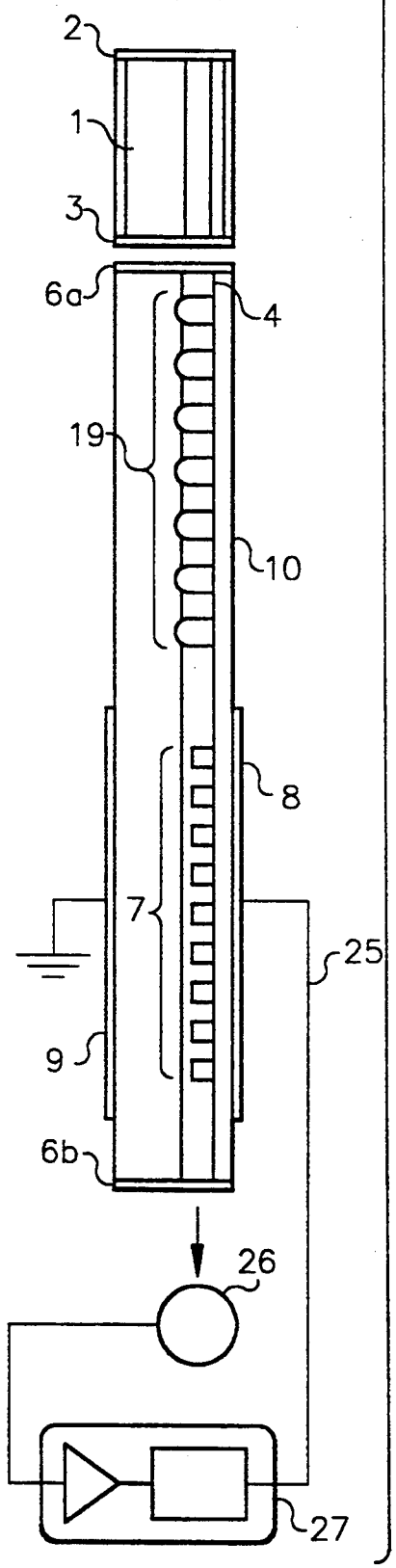
FIG. 5A
FIG. 5B

FREQUENCY TUNABLE WAVEGUIDE EXTENDED CAVITY LASER

BACKGROUND OF THE INVENTION

Tunable single-mode laser diode sources have potential uses in many areas including spectroscopy, coherent communication, and nonlinear frequency conversion. Particularly in the area of second harmonic frequency conversion, also known as second harmonic generation or SHG, the narrow band nature of this process dictates the need for a narrow band tunable pump source which can maintain optimum efficiency as a result of drifts in temperature, wavelength, or to compensate for device fabrication errors. If these optical frequency converting devices (laser diode pump source combined with a SHG device) are to be used as a means to convert invisible infrared radiation to visible radiation as would be their use as the source in optical disk recorders, printers, or display devices then light output stability, compactness, and low cost are important additional factors.

Standard commercially available single-mode laser diodes sometimes referred to as Fabry-Perot laser diodes can be tuned by varying their temperature or injection current or a combination of both. However, tuning a laser diode by these methods often leads to undesirable effects. For example, although a large range of tuning may be obtained by varying the temperature of the laser diode the tuning will be interrupted periodically by shifts in the lasing frequency. These frequency shifts or mode hops would be detrimental to the output of a SHG system since the result would be large drops in intensity of the frequency converted radiation. The same detrimental result would occur for injection current tuning due to mode hops as well as the fundamental pump intensity dependence on injection current.

In recent years much research has gone into tunable single-mode laser diodes which are free of these undesirable tuning characteristics. They are generally of two types referred to as Distributed Bragg Reflector (DBR) laser diodes or Distributed Feedback (DFB) laser diodes. Although they differ in structure, in the broadest terms, their spectral characteristics are a result of the incorporation of a grating structure in the cavity. The laser diodes are tuned by an independent injection current which modifies the index of refraction in the grating structure via a change in carrier density as a result of the change in current. The spectral and tuning characteristics of these laser diodes as known in the art are well suited for the applications discussed previously. Unfortunately, they are not as yet commercially available. Although they may be commercially available in the near future their initial cost could prove to be prohibitive.

An alternative to the DBR or DFB laser diodes involves the use of commercially available low cost Fabry-Perot laser diodes. These laser diodes can be made tunable through the utilization of an external optical feedback means. It has been known for some time that optical feedback can be used to control the oscillation frequency of a laser diode. (See R. W. Tkach and A. R. Chraplyvy, J. Lightwave Tech. LT-4, 1655 1986). Devices incorporating this effect referred to as external or extended cavity lasers are well known in the art. They are typically comprised of a Fabry-Perot laser diode with a frequency select portion of the emitted radiation being fed back to the laser diode via a reflective diffraction grating. The diffraction grating is often blazed and used in a Littrow configuration where the first order is reflected back into the laser diode. With enough feedback the laser diode will oscillate or "lock" to the frequency selected by the diffraction grating. By changing the angle of the grating with respect to the incident radiation it is possible to change the frequency selected by the diffraction grating there by tuning the laser diode. In some cases the front facet of the laser diode is partially reflective. In this case the external cavity is a perturbation of the laser diode cavity. In another case an attempt is made to anti-reflection (AR) coat the front facet to eliminate any reflection from this facet. In this case the cavity is incomplete. There is no feedback of radiation from the front facet and the laser diode by itself will not lase. The diffraction grating completes the cavity forming an extended cavity. In practice it is impossible to completely suppress reflections from the front facet resulting in some influence from the internal laser diode cavity. In either case the tuning principle is the same. The individual tuning characteristics differ slightly. For many applications the extended cavity laser scheme is preferred.

The narrow spectral linewidth, low noise, and tunability exhibited by extended cavity lasers make them attractive. Integration of the grating into a waveguide is recognized as a method for possibly reducing the size, weight, mechanical complexity and cost of the source. Such devices employing channel waveguides and etched gratings in glass have been demonstrated. (See D. A. Ackerman, M. I. Dahbura, Y. Shani, C. H. Henry, R. C. Henry, R. C. Kistler, R. F. Kazarinov, and C. Y. Kuo, Appl. Phys. Lett. 58, 449 1991). These devices involved an infrared laser diode source only and were not used for waveguide nonlinear frequency conversion nor did they include a means for frequency tuning.

A popular waveguide nonlinear frequency conversion technique for the SHG of visible light involves the periodic reversing of ferroelectric domains in ferroelectric materials to provide phasematching of the fundamental with the second harmonic. This technique often referred to as quasiphase matching or QPM is well known in the art. A device had been presented which utilized a periodically poled QPM $LiNbO_3$ waveguide for second-harmonic generation in an attempt to provide automatic QPM by using the periodically poled structure not only as the QPM element but also as a Bragg grating reflector. (K. Shinozaki, T. Fukunaga, K. Watanabe, and T. Kamijoh, J. Appl. Phys. 71, 22 1992). Problems with this technique arise from the fact that the conditions for Bragg reflection and QPM are distinct. As a result, impractical fabrication tolerances are placed on the period of the periodically poled structure. Recently, a device described by U.S. Pat. No. 5,185,752 to Welch and Waarts combines a periodically poled QPM nonlinear waveguide, a Bragg grating structure, and a means for achieving a TM polarization in the QPM waveguide section when coupled to a laser diode. The TM polarization allows use of the highest nonlinear optical coefficient in the most commonly used nonlinear optical materials. The structure described by U.S. Pat. No. 5,185,752 to Welch and Waarts does not include a device for frequency tuning.

SUMMARY OF THE INVENTION

It is an object of this invention to overcome the above drawbacks and provide a low cost, compact frequency tunable waveguide extended cavity laser which can be integrated with a waveguide nonlinear optical frequency converting portion resulting in a compact waveguide frequency convening extended cavity laser.

A further object of this invention is to provide a frequency tunable waveguide extended cavity laser producing radiation at a desired frequency comprising:

a) a laser diode having a reflecting rear facet forming one end of the cavity of the frequency tunable waveguide extended cavity laser and a front facet for emitting radiation;

b) a channel waveguide for receiving radiation from the front facet, a portion of the channel waveguide having an electro-optical material;

c) a Bragg grating reflector formed in or on the channel waveguide portion providing frequency select output coupling completing the cavity of the frequency tunable waveguide extended cavity laser; and d) means for applying an adjustable electric field to the Bragg grating reflector to change the refractive index of the electro-optic material to change the frequency of radiation produced by the frequency tunable waveguide extended cavity laser so as to be at a desired frequency.

In an alternate version of the invention the frequency tunable waveguide extended cavity laser is used as a tunable narrow-bandwidth pump source for a waveguide second harmonic optical frequency converting portion which is integrated into the same channel waveguide containing the frequency tunable Bragg grating reflector. A QPM waveguide portion is preferably chosen as the nonlinear optical frequency converting portion because of its usefulness in converting infrared radiation to visible light, high performance (as recognized in the art), and compatibility with a frequency tunable Bragg grating reflector.

In yet another version of the invention, additional benefits are realized by placing the waveguide nonlinear optical frequency converting portion between the laser diode and the Bragg grating reflector. In this extended cavity scheme the waveguide nonlinear optical frequency converting portion takes advantage of intracavity optical power enhancement increasing the efficiency of the nonlinear optical frequency conversion process.

ADVANTAGES

Frequency tunable waveguide extended cavity lasers according to this invention provide a compact, tunable, narrow linewidth, coherent radiation source.

The invention maintains optimum efficiency in nonlinear optical frequency conversion schemes such as the second harmonic generation of light via quasiphase matching as a result of drifts in temperature, wavelength, or to compensate for device fabrication errors. The invention also increases the efficiency of the generated second harmonic power via intracavity enhancement of the fundamental. This permits the use of lower power and hence lower cost laser diode pump sources.

BRIEF DESCRIPTION OF THE DRAWINGS

FIGS. 1a, 1b and 1c show top, side and front views of a frequency tunable waveguide extended cavity laser in accordance with this invention;

FIGS. 2a and 2b show an alternative embodiment (top and front views) of a frequency tunable waveguide extended cavity laser in accordance with this invention. The electrodes are positioned on a z-cut LiNbO$_3$ wafer as to produce an electric field parallel to the c-axis as shown;

FIGS. 4a, 5b and 4c show a frequency tunable waveguide extended cavity laser. In this embodiment a waveguide frequency converting portion is situated outside the cavity of the frequency tunable waveguide extended cavity laser; and FIGS. 5a and 5b show a frequency tunable waveguide extended cavity laser. In this embodiment a waveguide frequency converting portion is situated inside the cavity of the frequency tunable waveguide extended cavity laser.

DETAILED DESCRIPTION OF THE PREFERRED EMBODIMENTS

Figure 3A:
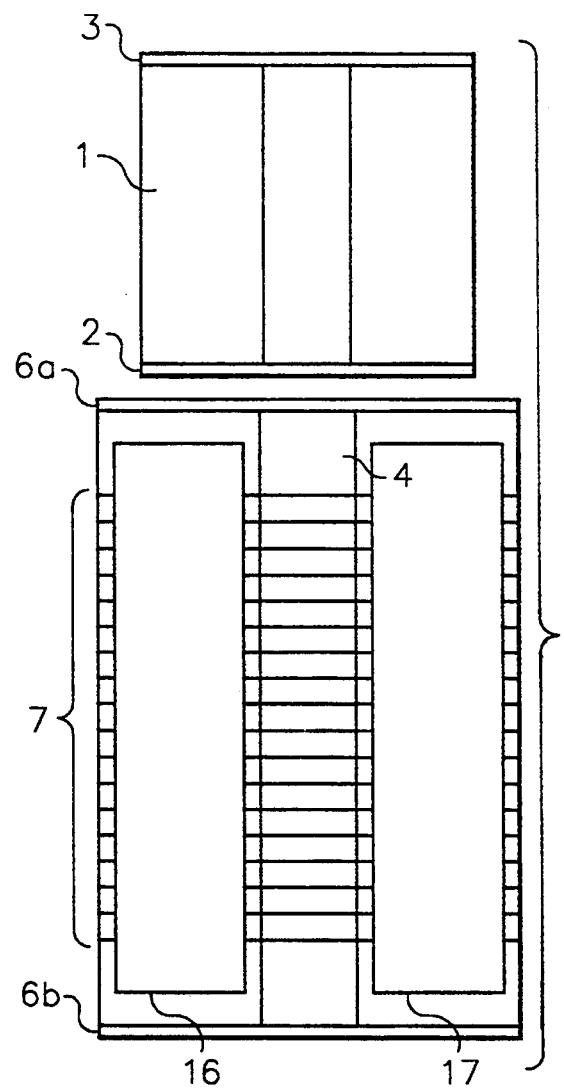
FIGS. 3a and 3b show an alternative embodiment (top and front views) of a frequency tunable waveguide extended cavity laser in accordance with this invention. The electrodes are positioned on a x-cut or y-cut LiNbO$_3$ wafer as to produce an electric field parallel to the c-axis as shown.

LiNbO$_3$, LiTaO$_3$, and KTiOPO$_4$ are preferred nonlinear optical materials for electro-optic and waveguide QPM devices. The following description refers to an embodiment of the invention which employs a commercially available Fabry-Perot laser diode which is coupled to a LiNbO$_3$ waveguide. The invention could as well be applied to other nonlinear optical materials. A frequency tunable waveguide extended cavity laser is shown schematically in FIGS. 1a, 1b and 1c. The laser diode 1 has an anti-reflective (AR) front facet coating 2 instead of the usual partially reflective coating. The AR coating is preferred although it is recognized that the device will still operate with a partially reflective coating. The reflecting rear facet coating 3 is conventional. This facet forms one end of the frequency tunable waveguide extended cavity laser. The laser diode 1 is end-coupled to a LiNbO$_3$ channel waveguide 4 which is fabricated from a polished single crystal LiNbO$_3$ wafer 5. Other coupling techniques such as those described in U.S. Pat. No. 5,185,752 to Welch et al could also be used. The embodiment employs a conventional surface modified LiNbO$_3$ channel waveguide which is produced by a proton-exchanged process. Such waveguide production techniques are well known in the art. It is recognized that other waveguide types could be used such as waveguides made from transparent thin film nonlinear organic or nonlinear inorganic materials. Examples of these alternate waveguide types are well known in the art. It is preferred that the channel waveguide have lateral dimensions such that the amount of radiation coupled from the laser into the channel waveguide is maximized while still supporting only the lowest order mode. If a z-cut LiNbO$_3$ wafer incorporating a conventional proton-exchanged waveguide is used then the waveguide will support only TM modes. (See D. F. Clark, A. C. G. Nutt, K. K. Wong, P. J. R. Laybourn, and R. M. De La Rue, J. Appl. Phys. 54 6218 1983). TM mode support occurs because the index of refraction is higher in the proton-exchanged region (as compared to the surrounding region) in a direction along the c-axis only, i.e., in a direction perpendicular to the plane of the wafer. In the direction parallel to the plane of the wafer the index of refraction is lower in the proton-exchanged region as compared to the surrounding region. Therefore, only for radiation polarized parallel to the c-axis can waveguiding occur. For the case of x-cut or y-cut LiNbO$_3$ wafers incorporating a conventional proton-exchanged channel waveguide only transverse electric (TE) modes would be supported. (See M. M. Abouelleil and F. J. Leonberger, J. Am Ceram. Soc. 72, 1311 1989). Although polarization selection may be achieved by rotation of the waveguide relative to the laser diode, or through the use of a half-wave plate, neither of these techniques are compatible with a low cost planarization technology. It is recognized that other electro-optic based polarization selection techniques that are compatible with planarization technology may be used. The waveguide AR coatings are placed by standard deposition techniques on the input facet 6a and output facet 6b of the LiNbO$_3$ channel waveguide 4. For example, a quarterwave layer of SiO$_2$ evaporated on the polished waveguide input and output facets should be sufficient.

A Bragg grating reflector 7 is incorporated into the LiNbO$_3$ channel waveguide 4 completing the cavity of the frequency tunable waveguide extended cavity laser. This Bragg grating reflector 7 can be produced by first forming a periodic masking layer with photoresist exposed by standard holographic techniques and then using standard ion-milling to remove material in the unmasked regions. An alternative method for producing a Bragg grating reflector involves the deposition of a thin film layer of an optically transparent material on the surface of the LiNbO$_3$ wafer 5 where then a periodic masking layer is formed and etched as described above. The thin film material may or may not be a nonlinear optical material. It may be organic or inorganic. It should have an index or refraction that is close to but not significantly higher than the LiNbO$_3$ channel waveguide index of refraction. In addition, it should not have an index of refraction lower than the buffer layer 10 index of refraction. Examples of qualifying materials include Ta$_2$O$_5$ and Si$_3$N$_4$ (assuming a buffer layer of SiO$_2$). The LiNbO$_3$ channel waveguide 4 has a length extending along the entire LiNbO$_3$ wafer. The LiNbO$_3$ wafer is long enough to accommodate the Bragg grating reflector 7. It may be necessary in the TM polarization case for an additional length of LiNbO$_3$ channel waveguide between the input facet 6a and the Bragg grating reflector 7 to extend beyond the evanescent TE mode decay length to ensure lasing of the inherently lower gain TM mode. The distance between the Bragg grating reflector 7 and the output facet 6b may have zero length or may be longer depending on the application. The two most important optical properties of the Bragg grating reflector 7 which impact device operation and performance are the reflectivity and bandwidth.

It is desirable to produce a Bragg grating reflector 7 such that the reflectivity is commensurate with optimum output coupling for the laser diode 1. Typically, this value is in the range of a few percent. The exact value for reflectivity will depend on the details of the laser diode as well as the coupling efficiency of the laser diode 1 to the LiNbO$_3$ channel waveguide 4. In general, it is desirable to produce a Bragg grating reflector with a small bandwidth. The exact value for this bandwidth will depend on the application of the frequency tunable waveguide extended cavity laser. The Bragg grating reflector 7 reflectivity increases with increasing length while the bandwidth decreases. The Bragg grating reflector reflectivity and bandwidth are also functions of the ratio of Bragg grating reflector depth to LiNbO$_3$ channel waveguide depth (the reflectivity and bandwidth increase with an increased ratio of Bragg grating reflector depth to LiNbO$_3$ channel waveguide depth) as well as the LiNbO$_3$ channel waveguide effective index of refraction (as the LiNbO$_3$ channel waveguide effective index of refraction decreases, the reflectivity and bandwidth increase). The Bragg grating reflector length may usefully range between 0.05 mm and 20 mm depending on the values of the other parameters. Preferred values would range from 0.5 mm to 10 mm. Bragg grating reflector depths usefully range from 50 Å to the depth of the LiNbO$_3$ channel waveguide mode. There is no advantage in a Bragg grating reflector depth extending beyond the LiNbO$_3$ channel waveguide mode depth. LiNbO$_3$ channel waveguide mode depths typically range from 1 to 2 $\mu$m in a proton exchanged waveguide where the effective index of refraction typically ranges from 0.01 to 0.15 below the (LiNbO$_3$) substrate index of refraction. The exact values would depend on the details of the fabrication process. The period of the grating A (see FIG. 1) is given by the Bragg condition $$\Lambda = m(\lambda/2N_{eff}),$$

where $\lambda$ is the wavelength at peak reflectivity, $N_{eff}$ is the waveguide effective index of refraction, and m is the grating order. It is desirable, in many cases, to use as low a grating order as possible in order to produce a grating with a small bandwidth (for a given length). The period for a first order grating at a wavelength of $\lambda = 860$ nm made from a typical LiNbO$_3$ proton-exchanged channel waveguide would be approximately 0.2 $\mu$m while a third order grating would be approximately 0.6 $\mu$m.

FIGS. 1a, 1b and 1c illustrate top 8 and bottom 9 metal electrodes placed such that an applied voltage results in an electric field oriented perpendicular to the plane of the wafer. In the case of the z-cut LiNbO$_3$ wafer (TM polarization) this electrode orientation would allow use of the large electro-optic coefficient $r_{33}$. The top 8 and bottom 9 electrodes have dimensions which correspond at least to the dimensions of the intersection of the LiNbO$_3$ channel waveguide 4 portion and the Bragg grating reflector 7. Somewhat larger electrode dimensions are desirable in order to assure uniform electric fields in said intersecting area. To avoid unnecessary light loss in the LiNbO$_3$ channel waveguide portion which lies between the electrodes, it is preferable to include a buffer layer 10 between the top electrode 8 and the Bragg grating reflector 7. The buffer layer 10 should be transparent at both the fundamental and the second harmonic frequencies. It may be electrically insulating or conducting. SiO$_2$ is an example of a preferred inorganic insulating buffer layer material. Organic materials are also useful as buffer layers. The buffer layer 10 thickness should be at least such that the evanescent field of the guided mode does not extend to the conducting top metal electrode 8. The specific refractive index of the buffer layer 10 will influence the LiNbO$_3$ channel waveguide modes and cut-off thicknesses and so must be taken into account in the design. In the present specific embodiment it can be assumed for simplicity that the buffer layer 10 extends over the entire LiNbO$_3$ wafer 5 surface.

The thickness of the LiNbO$_3$ wafer 5 is determined by a tradeoff between required mechanical rigidity and control voltage level, since the electro-optic control function is an electric field sensitive quantity. Minimum LiNbO$_3$ wafer thickness is about 50 $\mu$m. It is possible to gain advantage by employing a LiNbO$_3$ wafer thickness capable of providing excellent mechanical properties and circumventing the problem of increased voltage requirement by milling the LiNbO$_3$ wafer in way of the bottom metal electrode portion to a smaller LiNbO$_3$ wafer thickness thus reducing the required voltage level.

It is recognized that z-cut LiNbO$_3$ wafer surface electrodes 11, 12 and 13 illustrated in FIGS. 2a and 2b along with the voltage polarities shown will result in a component of the electric field directed along the c-axis permitting voltage controlled frequency tuning of the laser diode via the electro-optic coefficient r$_{33}$. The voltage is applied and adjusted via a voltage adjusting system 14. Such a system is well known in the art. In this configuration a buffer layer 10 is still necessary, however, the LiNbO$_3$ wafer need not be thinned.

Figure 3B:
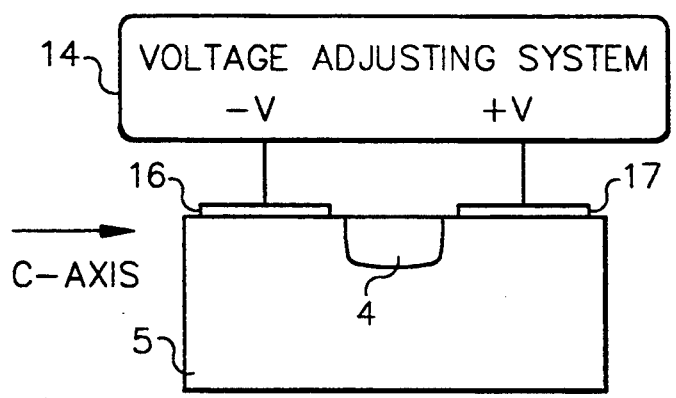

For x-cut or y-cut LiNbO$_3$ wafers (TE polarization) it is preferred that the applied electric field be in a direction parallel to the plane of the wafer so that the electro-optic coefficient r$_{33}$ can be used. It is recognized that the surface electrode geometry illustrated in FIGS. 3a and 3b would suffice. x-cut or y-cut LiNbO$_3$ wafer surface electrodes 16 and 17 placed on either side of the LiNbO$_3$ channel waveguide 4 would result in the appropriate field direction. A voltage adjusting system 14 would permit frequency tuning of the laser diode. In this case a buffer layer would not be necessary nor would the wafer need to be thinned.

As stated previously, optical feedback provided to the laser diode by the Bragg grating reflector will cause the laser diode to oscillate at the wavelength selected by the Bragg grating reflector. The wavelength, $\lambda$ at which the Bragg grating reflector reflects the most efficiently is given by the Bragg condition stated previously:

$$\lambda = 2n(\Lambda/m).$$

In this last expression it is assumed for simplicity that for a proton exchanged LiNbO$_3$ channel waveguide N$_{eff} \approx$ n, where n is the LiNbO$_3$ wafer index of refraction. This expression illustrates the ability to change the wavelength at which the Bragg grating reflector reflects the most efficiently and hence when coupled to a laser diode the wavelength at which the laser diode will oscillate by changing the index of refraction. The change in lasing wavelength, $\Delta\lambda$ is related to the index change, $\Delta n$ by $$\Delta\lambda = \lambda(\Delta n/n).$$

From the previously described geometries, the index of refraction can be changed through the electro-optic coefficient, r$_{33}$ by application of an electric field, E as given by $$\Delta n(E) = -n^3 r_{33} E/2.$$

For the TM polarization case and the electrode geometry of FIG. 1, the electric field, E is directly proportional to the applied voltage V, the constant of proportionality being related to the electrode separation, buffer layer thickness and dielectric constants of the electro-optic and buffer layer materials. In the typical occurrence where the buffer layer thickness is much smaller than the electrode separation, and their dielectric constants are of the same order, then the electric field, E is given approximately by $$E = V/d,$$

where d is the electrode separation. Combining the last three expressions yields $$\Delta\lambda = -(\lambda\, n_e^3\, r_{33}/2)(V/d),$$

where the extraordinary index of refraction, n$_e$ is used.

An input wavelength of 860 nm is used. Such a wavelength may be conveniently produced by commercial diode lasers. From the published literature (See S. Fries and S. Bauschulte, Phys. Stat. Sol. (a) 125, 369 1991) it can be found with some interpolation, that for LiNbO$_3$, n$_3$(860 nm) = 2.168 and $$r_{33}(860\ nm) = 29.9 \times 10^{-12}\ m/V.$$

Thus the change in the lasing wavelength is given by $$\Delta\lambda = -(6.043 \times 10^{-2})(V/d)$$

in units of Å when V is in kV and d is in cm. This implies a field of 16.5 kV/cm is needed per Å of tuning. Fields providing a few Å to 1 nm of tuning should be realizable with reasonable voltages by using the electrode geometries discussed above.

In another embodiment of the invention the tunable laser diode device is integrated with a periodically-poled QPM waveguide portion to produce second harmonic light. It is recognized that other phase matching techniques could be used such as those based on birefringence or waveguide optical mode matching. Such techniques are well known in the art. Such a device would be useful to convert infrared radiation to visible light. This device is shown schematically in FIGS. 4a, 4b and 4c. The device contains the same elements as the device in FIGS. 1a, 1b and 1c with the addition of a periodically-poled QPM portion 19 which is fabricated on the same substrate as the Bragg grating reflector 7. In this case the channel waveguide 4 (and LiNbO$_3$ substrate 5) is extended along the entire periodically poled QPM portion 19. The period of the Bragg grating reflector 7 is designed to match (within the tuning range of the Bragg grating reflector) the input fundamental wavelength of maximum frequency conversion of the periodically-poled QPM portion 19. For maximal second harmonic power conversion the TM polarized version of the device is used. This would allow use of the large r$_{33}$ electro-optic coefficient for grating tuning described earlier while also using the large nonlinear optical coefficient, d$_{33}$ for second harmonic conversion. The dimension of the periodically poled QPM portion may be usefully between 1 mm and 30 mm in length, and preferably between 3 mm and 20 mm with the optimal length being between 5 mm and 15 min. The LiNbO$_3$ channel waveguide portion extending beyond the periodically poled QPM portion may have zero length or may extend on both sides of the periodically poled QPM portion depending on the application. It is recognized that surface electrodes 11, 12, and 13 of the type illustrated in FIGS. 2a and 2b may be used instead of the electrodes 8 and 9 shown in FIGS. 4a, 4b and 4c. The voltage applied to the Bragg grating reflector may be used to tune the laser diode to maintain maximum second harmonic power. This optimization may be done manually or through an electronic means via a feedback loop 25 which monitors the second harmonic power with a photodiode 26 and adjusts the laser frequency accordingly by application of a voltage to the grating electrodes via a feedback controlled voltage adjusting system 27. Such control systems are well known in the art.

An alternate embodiment of this device illustrated in FIGS. 5a and 5b places the periodically poled QPM portion 19 at the input end of the wafer in between the laser diode 1 and the Bragg grating reflector 7. In this case the Bragg grating reflector should be made highly reflecting at the fundamental wavelength while transmissive at the second harmonic wavelength. The Bragg grating reflector can be made transmissive at the second harmonic wavelength due to the inherent LiNbO$_3$ substrate material dispersion. For example, a first order grating designed to be highly reflective at a fundamental wavelength of $\lambda=860$ nm in LiNbO$_3$ (using a value of $n_e=2.168$) would need a period of 0.2 $\mu$m. Because of the material dispersion the Bragg grating reflectivity peak wavelength nearest to the second harmonic wavelength ($\lambda=430$ nm) would approximately occur at $\lambda=460$ nm. As long as this wavelength was outside the reflectivity band of the Bragg grating reflector, the second harmonic will pass unattenuated. The device in this configuration is designed to take advantage of intracavity power enhancement at the fundamental wavelength. (See Zernike and Midwinter, Applied Nonlinear Optics [Wiley, New York 1973] Chap. 5). The higher circulating power within the cavity (the cavity is defined at one end by the laser diode rear facet coating 3 and on the other end by the Bragg grating reflector 7) at the fundamental wavelength would produce a larger amount of second harmonic power. The exact power enhancement will depend on the net gain of the cavity relative to the net loss. The gain in the cavity is provided by the laser diode while the loss is incurred through a number of items including the laser diode 1 to LiNbO$_3$ channel waveguide 4 coupling loss; losses in the LiNbO$_3$ channel waveguide from scattering and absorption; reflectivity losses from the laser diode rear coating 3 and the Bragg grating reflector 7; and losses to the fundamental from the second harmonic conversion process. It is recognized that tuning of the laser diode via a voltage applied to the Bragg grating reflector for optimization of the generated second harmonic power may be accomplished by a similar system as outlined in the preceding paragraph.

The invention has been described in detail with particular reference to preferred embodiments thereof, but it will be understood that variations and modifications can be affected within the spirit and scope of the invention.

PARTS LIST 1 laser diode
2 front facet coating of laser diode
3 rear facet coating of laser diode
4 LiNbO$_3$ channel waveguide
5 LiNbO$_3$ wafer
6a waveguide input facet
6b waveguide output facet
7 Bragg grating reflector
8 top metal electrode
9 bottom metal electrode
10 buffer layer
11 z-cut LiNbO$_3$ surface electrode
12 z-cut LiNbO$_3$ surface electrode
13 z-cut LiNbO$_3$ surface electrode
14 voltage adjusting system
16 x-cut or y-cut LiNbO$_3$ surface electrode
17 x-cut or y-cut LiNbO$_3$ surface electrode
19 periodically poled QPM portion
25 feedback loop
26 photodiode
27 feedback controlled voltage adjusting system

What is claimed is:

1. A frequency tunable waveguide extended cavity laser producing radiation at a desired frequency comprising:
   a) a laser diode having a reflecting rear facet and a front facet for emitting radiation;
   b) a channel waveguide for receiving radiation from said front facet of said laser diode, a portion of said channel waveguide having an electro-optical material in the waveguide channel that undergoes a refractive index change in response to an applied electric field;
   c) a Bragg grating reflector formed relative to said channel waveguide portion having said electro-optical material; and
   d) means for applying an adjustable electric field to said Bragg grating reflector to change the refractive index of said electro-optic material so as to be at a desired frequency.

2. The device of claim 1 wherein the front facet of said laser diode is coated with a partially reflective coating.

3. The device of claim 1 wherein the front facet of said laser diode is coated with an anti-reflective coating.

4. The device of claim 1 wherein said Bragg grating reflector is composed of said electro-optic material.

5. The device of claim 1 wherein said Bragg grating reflector is composed of an optically transparent inorganic material positioned on the surface of said channel waveguide.

6. The device of claim 1 wherein said Bragg grating reflector is composed of an optically transparent organic material positioned on the surface of said channel waveguide.

7. The device of claim 1 wherein said means for applying an adjustable electric field to said Bragg grating reflector comprises an adjustable voltage system and a pair of conducting electrodes which surround said Bragg grating reflector.

8. A frequency tunable waveguide extended cavity laser producing radiation at a desired frequency comprising:
   a) a laser diode having a reflecting rear facet and a front facet for emitting radiation;
   b) a channel waveguide for receiving radiation from said front facet of said laser diode, a portion of said channel waveguide having an electro-optical material in the waveguide channel that undergoes a refractive index change in response to an applied electric field;
   c) a Bragg grating reflector formed relative to said channel waveguide portion having said electro-optical material;
   d) means for applying an adjustable electric field to said Bragg grating reflector to change the refractive index of said electro-optic material so as to be at a desired frequency;

e) a nonlinear optical frequency convening waveguide portion having a nonlinear optical material which converts the frequency of said desired frequency to a higher frequency; and f) detection means opto-electronically responsive to the frequency converted radiation for continuously measuring the frequency converted radiation power, and feedback means for dynamically controlling said desired frequency so as to be at a frequency for optimum frequency conversion.

9. The device of claim 8 wherein the front facet of said laser diode is coated with a partially reflective coating.

10. The device of claim 8 wherein tile front facet of said laser diode is coated with an anti-reflective coating.

11. The device of claim 8 wherein said Bragg grating reflector is composed of said electro-optic material.

12. The device of claim 8 wherein said Bragg grating reflector is composed of an optically transparent inorganic material positioned on the surface of said channel waveguide.

13. The device of claim 8 wherein said Bragg grating reflector is composed of an optically transparent organic material positioned on the surface of said channel waveguide.

14. The device of claim 8 wherein said means for applying an adjustable electric field to said Bragg grating reflector comprises an adjustable voltage system and a pair of conducting electrodes which surround said Bragg grating reflector.

15. The device of claim 8 wherein said electro-optic material and said nonlinear optical material are the same material.

16. A frequency tunable waveguide extended cavity laser producing radiation at a desired frequency comprising:

a) a laser diode having a reflecting rear facet and a front facet for emitting radiation;

b) a channel waveguide for receiving radiation from said front facet of said laser diode, a portion of said channel waveguide having an electro-optical material in the waveguide channel that undergoes a refractive index change in response to an applied electric field;

c) a Bragg grating reflector formed relative to said channel waveguide portion having said electro-optical material;

d) a nonlinear optical frequency converting waveguide portion having a nonlinear optical material which converts the frequency of said desired frequency to a higher frequency and for which said nonlinear optical frequency converting waveguide portion is located in between said laser diode and said Bragg grating reflector;

e) means for applying an adjustable electric field to said Bragg grating reflector to change the refractive index of said electro-optic material so as to be at a desired frequency; and f) detection means opto-electronically responsive to the frequency converted radiation for continuously measuring the frequency converted radiation power, and feedback means for dynamically controlling said desired frequency so as to be at a frequency for optimum frequency conversion.

17. The device of claim 16 wherein the front facet of said laser diode is coated with a partially reflective coating.

18. The device of claim 16 wherein the front facet of said laser diode is coated with an anti-reflective coating.

19. The device of claim 16 wherein said Bragg grating reflector is composed of said electro-optic material.

20. The device of claim 16 wherein said Bragg grating reflector is composed of an optically transparent inorganic material positioned on the surface of said channel waveguide.

21. The device of claim 16 wherein said Bragg grating reflector is composed of an optically transparent organic material positioned on the surface of said channel waveguide.

22. The device of claim 16 wherein said means for applying an adjustable electric field to said Bragg grating reflector includes an adjustable voltage system and a pair of conducting electrodes which surround said Bragg grating reflector.

23. The device of claim 16 wherein said electro-optic material and said nonlinear optical material are the same material.

* * * * *